United States Patent
Wong et al.

(10) Patent No.: US 9,713,287 B2
(45) Date of Patent: Jul. 18, 2017

(54) INTEGRATED THERMAL INSERTS AND COLD PLATE

(71) Applicant: Emerson Network Power—Embedded Computing, Inc., Tempe, AZ (US)

(72) Inventors: Suzanne Marye Wong, Tempe, AZ (US); Martin Peter John Cornes, Phoenix, AZ (US); Robert Charles Tufford, Chandler, AZ (US)

(73) Assignee: Artesyn Embedded Computing, Inc., Tempe, AZ (US)

( * ) Notice: Subject to any disclaimer, the term of this patent is extended or adjusted under 35 U.S.C. 154(b) by 324 days.

(21) Appl. No.: 13/741,710

(22) Filed: Jan. 15, 2013

(65) Prior Publication Data

US 2014/0198457 A1   Jul. 17, 2014

(51) Int. Cl.
*H05K 7/20*   (2006.01)
(52) U.S. Cl.
CPC ................................ *H05K 7/20545* (2013.01)
(58) Field of Classification Search
CPC ........... H05K 7/20545; H05K 7/20509; H05K 7/20218; H05K 7/20254; H05K 7/20627; H05K 7/20628; H05K 7/20629; H05K 7/2063; H05K 7/20631; H05K 7/20632; H05K 7/20633; H05K 7/20634; H05K 7/20635; H05K 7/20636; H05K 1/0201; H05K 1/0202; H05K 1/0203
See application file for complete search history.

(56) References Cited

U.S. PATENT DOCUMENTS

| | | | | |
|---|---|---|---|---|
| 4,322,776 A | * | 3/1982 | Job et al. | 361/720 |
| 4,962,444 A | * | 10/1990 | Niggemann | 361/702 |
| 5,057,968 A | * | 10/1991 | Morrison | 361/700 |
| 5,471,367 A | * | 11/1995 | Krumweide et al. | 361/719 |
| 5,506,751 A | * | 4/1996 | Chatel | 361/690 |
| 5,509,468 A | * | 4/1996 | Lopez | 165/144 |

(Continued)

FOREIGN PATENT DOCUMENTS

CN   102110762 A   6/2011

OTHER PUBLICATIONS

Chinese Office Action and Search Report for Application No. 201410014509.1 dated Dec. 3, 2015, and its English translation thereof.

(Continued)

*Primary Examiner* — David M Sinclair
*Assistant Examiner* — Theron S Milliser
(74) *Attorney, Agent, or Firm* — Harness, Dickey & Pierce, P.L.C.

(57) ABSTRACT

A cooling system having integrated cold plate extending member and cold plate for an electronics enclosure includes a chassis having multiple heat producing boards positioned in side-by-side parallel configuration having successive ones of the boards separated by a cavity thereby defining multiple ones of the cavities. A cold plate assembly includes a base unit of a thermally conductive material. The cold plate assembly also includes multiple cold plate extending members connected to the base unit. Successive ones of the cold plate extending members are spaced to be slideably received in one of the cavities such that the cold plate extending member received between any two successive boards is in direct contact with both of the successive ones of the boards.

19 Claims, 3 Drawing Sheets

(56) References Cited

U.S. PATENT DOCUMENTS

| | | | |
|---|---|---|---|
| 5,670,936 A | 9/1997 | Estes et al. | |
| 5,756,227 A * | 5/1998 | Suzuki et al. | 429/62 |
| 6,055,157 A * | 4/2000 | Bartilson | 361/699 |
| 6,072,697 A * | 6/2000 | Garcia-Ortiz | 361/704 |
| 6,086,404 A * | 7/2000 | Giese et al. | 439/377 |
| 6,357,514 B1 * | 3/2002 | Sasaki et al. | 165/80.3 |
| 6,393,853 B1 * | 5/2002 | Vukovic et al. | 62/259.2 |
| 6,498,708 B2 | 12/2002 | Schilloff et al. | |
| 6,498,723 B1 * | 12/2002 | Konshak et al. | 361/679.34 |
| 6,560,107 B1 * | 5/2003 | Beck et al. | 361/699 |
| 6,804,117 B2 * | 10/2004 | Phillips et al. | 361/700 |
| 6,858,344 B2 * | 2/2005 | Marukawa et al. | 429/148 |
| 7,148,452 B2 | 12/2006 | Peterson et al. | |
| 7,385,812 B1 * | 6/2008 | Konshak et al. | 361/690 |
| 7,408,782 B2 * | 8/2008 | Austin et al. | 361/716 |
| 7,460,367 B2 * | 12/2008 | Tracewell et al. | 361/679.48 |
| 7,551,438 B2 * | 6/2009 | Seki | 361/699 |
| 7,552,758 B2 * | 6/2009 | Garner et al. | 165/80.4 |
| 7,573,715 B2 * | 8/2009 | Mojaver et al. | 361/716 |
| 7,675,748 B2 * | 3/2010 | Matsushima et al. | 361/679.53 |
| 8,000,103 B2 * | 8/2011 | Lipp et al. | 361/702 |
| 8,004,841 B2 * | 8/2011 | Cipolla et al. | 361/699 |
| 8,004,842 B2 * | 8/2011 | Huang et al. | 361/700 |
| 8,403,030 B2 * | 3/2013 | Payne | 165/80.4 |
| 8,477,498 B2 * | 7/2013 | Porreca et al. | 361/704 |
| 2005/0089750 A1 * | 4/2005 | Ng et al. | 429/120 |
| 2006/0250772 A1 * | 11/2006 | Salmonson et al. | 361/698 |
| 2008/0164008 A1 * | 7/2008 | Austin | H05K 7/1404 165/80.2 |
| 2010/0085712 A1 * | 4/2010 | Hrehor et al. | 361/699 |
| 2012/0020004 A1 * | 1/2012 | Rau et al. | 361/679.31 |
| 2012/0026670 A1 * | 2/2012 | Rau et al. | 361/679.31 |
| 2012/0113586 A1 * | 5/2012 | Rau et al. | 361/679.47 |

OTHER PUBLICATIONS

English translation of Chinese Office Action for Application No. 201410014509.1, dated Nov. 30, 2016.
English Translation of Chinese Office Action for Application No. 201410014509.1, dated Jul. 20, 2016.

* cited by examiner

INTEGRATED THERMAL INSERTS AND COLD PLATE

FIELD

The present disclosure relates to chassis mounted electronic board cooling using cold plates.

BACKGROUND

This section provides background information related to the present disclosure which is not necessarily prior art.

Electrical components such as boards and card racks generate heat during operation that must be removed for proper operation. Where multiple boards are grouped in a chassis or cabinet it is known to mount the boards on a cold plate that conductively removes the heat. Existing cold plate technology relies on having two separate components, the chassis and the cold plate, which are bolted together. The component boards are typically connected to a board conduction frame and the board conduction frame is wedged into contact with the cold plate as the sole means to provide contact for heat transfer. Heat transfer is not optimized for this construction due to the inefficiency of having less than optimal surface area contact with the cold plate.

SUMMARY

This section provides a general summary of the disclosure, and is not a comprehensive disclosure of its full scope or all of its features.

According to several aspects, an integrated cold plate member and cold plate system for cooling an electronics enclosure includes a chassis having first and second heat producing boards positioned in side-by-side configuration with the boards separated by a first cavity. A cold plate assembly includes: a base unit of a thermally conductive material; and a first cold plate member connected to and conductively cooled by the base unit, the first cold plate member slideably received in the first cavity such that the first cold plate member is in direct contact with both the first and second boards.

According to other aspects, an integrated cold plate member and cold plate system for cooling an electronics enclosure includes a chassis having multiple heat producing component boards positioned in side-by-side configuration having successive ones of the boards separated by a cavity thereby defining multiple cavities. A cold plate assembly includes: a base unit of a thermally conductive material; and multiple cold plate members connected to the base unit, successive ones of the cold plate members spaced to be slideably received in successive ones of the cavities such that any one of the cold plate members received between any two successive ones of the boards is in direct contact with both of the successive ones of the boards.

According to still other aspects, an integrated cold plate member and cold plate system for cooling an electronics enclosure includes a chassis, having: an alignment frame having multiple alignment pins extending therefrom; multiple heat producing circuit boards positioned in a side-by-side parallel configuration, each connected to the alignment frame using one of the alignment pins, successive ones of the circuit boards separated by a cavity thereby defining multiple equally spaced cavities; and multiple parallel elongated slots. A cold plate assembly includes: a base unit; and multiple cold plate members connected to the base unit. Successive ones of the cold plate members are spaced to be slideably received in one of the cavities such that the cold plate member received between any two successive ones of the circuit boards is in direct contact with both of the successive ones of the circuit boards, thereby acting to conductively remove heat generated by the circuit boards via the cold plate members.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
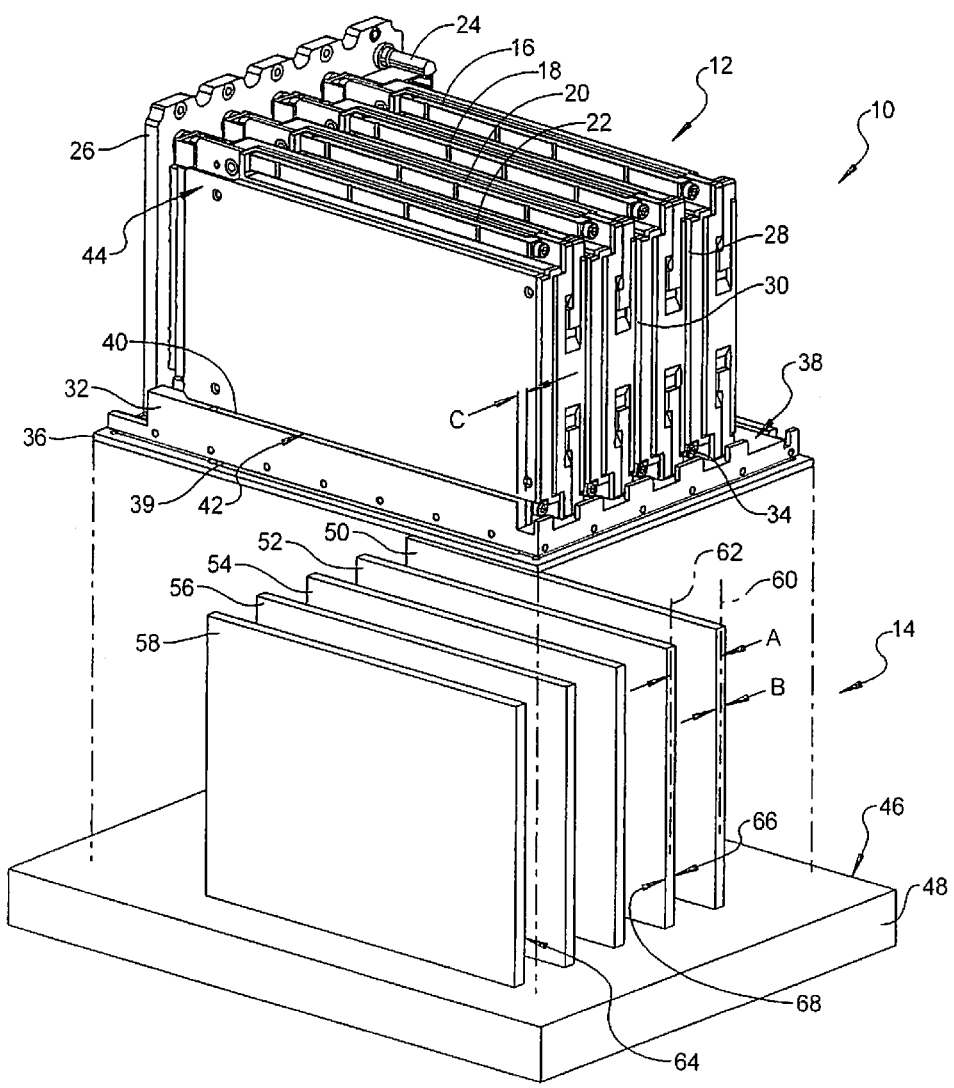
FIG. 1 is a front right perspective assembly view of an integrated thermal insert and cold plate assembly of the present disclosure prior to installation.

Referring to FIG. 1, a chassis cooling system 10 includes a component board assembly 12 which is frictionally engaged with a cold plate assembly 14 to establish conductive cooling of the electrical components of component board assembly 12. The component board assembly 12 includes a plurality of component boards, such as electronic circuit boards, which generate heat during operation which must be removed for proper operation of the system. In an exemplary configuration, the multiple component boards include a first component board 16, a second component board 18, a third component board 20, and a fourth component board 22. Each of the first, second, third, and fourth component boards 16, 18, 20, 22 are arranged in a parallel order with respect to each other and are retained in parallel relationship using a plurality of alignment pins 24 which extend from an alignment frame 26. Each of the component boards 16, 18, 20, 22 is slideably and/or mechanically engaged with one of the alignment pins 24 during installation of the component board. When the component boards 16, 18, 20, 22 are received in their parallel alignment configuration, each successive pair of component boards are separated by a cavity; for example a first cavity 28 spatially separates the first and second component boards 16, 18, and a second cavity 30 spatially separates the second and third component boards 18, 20. Similar cavities also separate subsequent pairs of the component boards.

At opposed sides of the component board assembly 12 are positioned perimeter frame members 32, only one of which is shown for clarity. The perimeter frame members 32 contact the outermost ones of the component boards, for example first and fourth component boards 16, 22. In addition, a chassis front end frame 34 retains opposite ends of each of the component boards 16, 18, 20, 22 with respect to alignment frame 26. Each of the perimeter frame members 32, the alignment frame 26, and the chassis end frame 34 are connected to a chassis base frame 36. The chassis base frame 36 includes a component board support surface 38 which is substantially planar such that all of the component boards 16, 18, 20, 22 are co-located with respect to the component board support surface 38, therefore helping to maintain the alignment between individual component boards. A plurality of elongated base frame through-slots 39 are created in chassis base frame 36, each aligned with one of the cavities, including first cavity 28 and second cavity 30. Base frame through-slots 39 are further aligned with and slideably receive one of multiple cold plate members 50, 52, 54, 56, 58 which will be described in further detail below.

Each of the perimeter frame members 32 includes an elongated slot 40 which also freely extends through the chassis base frame 36. An inner wall 42, defined by the elongated slot 40 of the perimeter frame members 32, is positioned coplanar with respect to an outer facing wall 44 of each of the outermost component boards. For example, the outer facing wall 44 of fourth component board 22 is oriented coplanar with respect to inner wall 42.

A planar upper surface 46 of a cold plate base unit 48 faces an underside of the chassis base frame 36 and receives the chassis base frame 36 in an installed position which will be described in greater detail in reference to FIG. 2. Extending normally with respect to planar upper surface 46 are multiple cold plate members. According to several aspects, these include a first, second, third, fourth, and fifth cold plate member 50, 52, 54, 56, 58. Each of the cold plate members 50, 52, 54, 56, 58 is connected to the planar upper surface 46 of cold plate base unit 48, and in several aspects can be integrally connected to the base unit 48. In addition, the cold plate members 50, 52, 54, 56, 58 are configured parallel to each other, and successive ones of the cold plate members 50, 52, 54, 56, 58 are spaced at a common spacing. For example, first and second cold plate members 50, 52 each include a vertical centerline, such as a first centerline 60 and a second centerline 62 which are spatially separated by a common spacing distance "A". Although not limiting to the disclosure, according to several aspects the spacing distance "A" is repeated between any two successive ones of the cold plate members 50, 52, 54, 56, 58. If desired, the spacing distance "A" can be modified to suit different width cold plate members, for example to accommodate component boards of different or varying heat generating capacity.

A thickness "B" of each of the cold plate members 50, 52, 54, 56, 58 is substantially equal to or greater than a width of the corresponding cavities, such as first and second cavities 28, 30. In addition, the thickness "B" of the outermost ones of the cold plate members, such as first and fifth cold plate members 50, 58, is also substantially equal to a width "C" of the elongated slots 40 created in the perimeter frame members 32.

The orientation and spacing of the cold plate members 50, 52, 54, 56, 58 therefore ensures that each of the cold plate members 50, 52, 54, 56, 58 will contact successive ones of the component boards 16, 18, 20, 22 when the cold plate members 50, 52, 54, 56, 58 are slideably received in the cavities between the component boards. For example, second cold plate member 52 is slideably received between first and second component boards 16, 18 such that opposed planar faces 66, 68 on opposite sides of second cold plate member 52 directly contact facing surfaces of both the first and second component boards 16, 18 when installed in the installed position shown in FIG. 2. This direct contact between individual ones of the cold plate members 50, 52, 54, 56, 58 and the paired component boards ensures that direct contact is made on both sides or opposed sides of each of the component boards 16, 18, 20, 22 by one of the cold plate members 50, 52, 54, 56, 58, therefore providing conductive cooling to both sides of all of the component boards 16, 18, 20, 22.

The outermost ones of the cold plate members which includes, in several embodiments the first and fifth cold plate members 50, 58, have only a single surface that makes direct contact with one of the component boards, which according to several aspects includes the first and fourth component boards 16, 22. An inwardly directed surface 64 of fifth cold plate member 58 directly contacts the outer facing wall 44 of fourth component board 22. This is ensured by the alignment of the inner wall 42 of perimeter frame member 32 in a coplanar relationship with outer facing wall 44 of the fourth component board 22.

Figure 2:
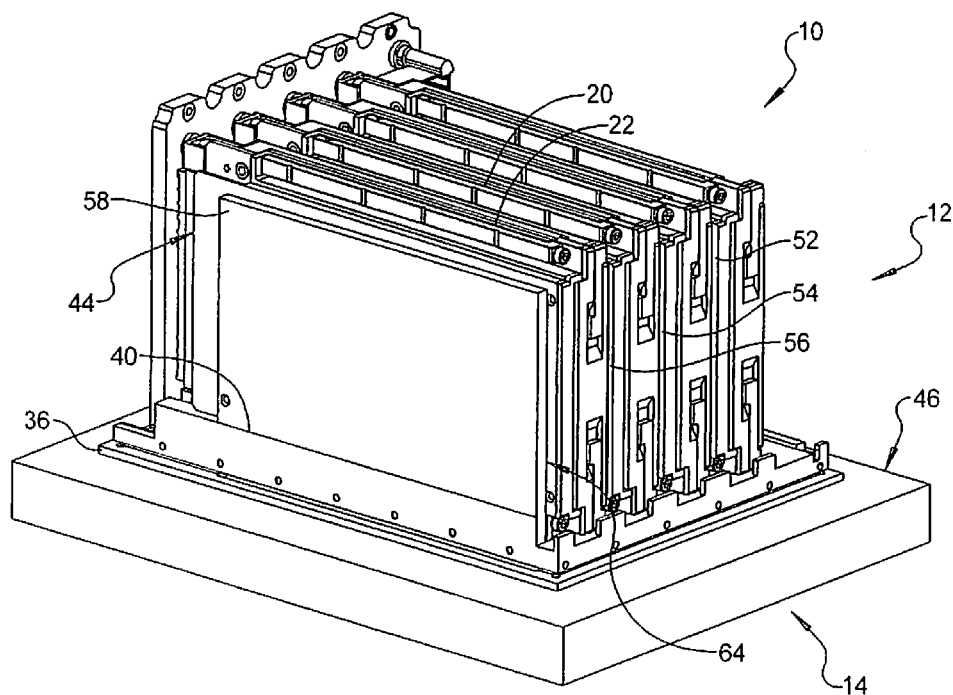
FIG. 2 is a front right perspective view of the assembly of FIG. 1 in an installed condition.

Referring to FIG. 2, component board assembly 12 has been lowered onto cold plate base unit 48 of the cold plate assembly 14 such that individual cold plate members are slideably received between the individual paired or successive ones of the first, second, third, and fourth component boards 16, 18, 20, 22. As previously described, the inwardly directed surface 64 of fifth cold plate member 58 is in direct contact with the outer facing wall 44 of fourth component board 22. A similar configuration will be provided for the other outermost one of the component boards, such as first component board 16. It should be evident that the quantity of component boards is not limited by the present disclosure. For example, less than four or more than four component boards can be provided. In addition, to ensure that each of the component boards is contacted on opposite facing surfaces by a cold plate member, according to several aspects a quantity of the cold plate members always exceeds a quantity of the component boards by one. Heat generated by any of the operating component boards is conductively drawn by the individual cold plate members down to the cold plate base unit 48. The frictional direct contact between each cold plate and one side or face of one of the component boards maximizes conductive heat transfer to the cold plate.

According to several aspects, each of the cold plate members extends substantially normal to the planar upper surface 46 of the base unit 48, and a quantity of the cold plate members exceeds a quantity of the boards by one such that each board is contacted on opposite faces of the board by one of the cold plates.

Referring to FIG. 3 and again to FIGS. 1-2, the chassis base frame 36 can be constructed of multiple components, including a base frame plate 70 having a base frame structure 72 connected to base frame plate 70. In addition to the perimeter frame members 32 having elongated slots 40, multiple component support bars 74 can be provided, each having a component support bar elongated slot 76 which is aligned with and slideably receives one of the cold plate members 50, 52, 54, 56. According to several aspects, the base frame structure 72 is connected to an upper facing surface 78 of base frame plate 70.

Figure 3:
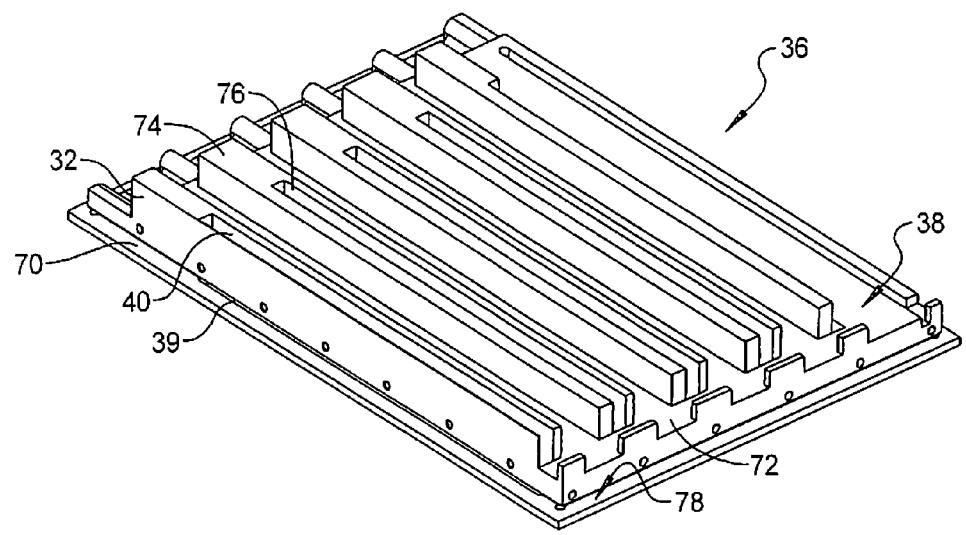
FIG. 3 is a front right perspective view of a chassis base frame of the thermal insert of FIGS. 1 and 2.
Figure 4:
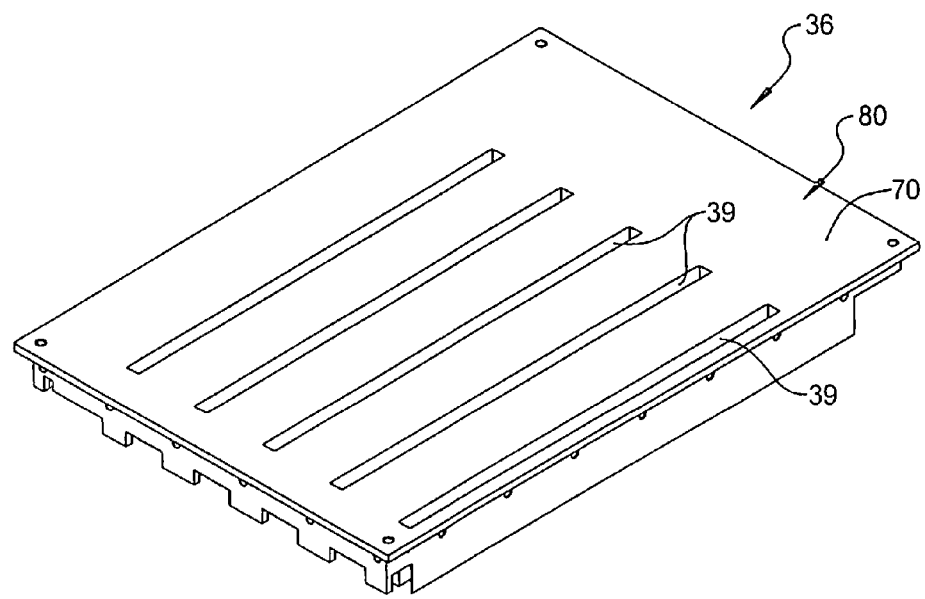
FIG. 4 is a bottom left perspective view of the chassis base frame of FIG. 3.

Referring to FIG. 4 and again to FIGS. 1-3, a lower facing surface 80 of base frame plate 70 is substantially planar to align with the planar upper surface 46 of cold plate base unit 48. The multiple base frame through-slots 39 are aligned with individual ones of the cold plate members 50, 52, 54, 56, 58 during joining of component board assembly 12 to cold plate assembly 14.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A system for cooling an electronics enclosure, comprising:
    a chassis assembly including:
        first and second heat producing boards positioned in side-by-side configuration, the heat producing boards separated by a first cavity;
        an alignment frame supporting each respective first and second heat producing boards, each of the first and second heat producing boards being connected to and arranged perpendicularly to the alignment frame along respective first edges of the respective first and second heat producing boards; and
        a planar base frame arranged generally perpendicularly to the alignment frame and including a support surface supporting respective second edges of the first and second heat producing boards, the planar base frame including an elongated slot formed therein, the elongated slot defined by an open aperture passing perpendicularly through the planar base frame; and
    a cold plate assembly including:
        a base unit of a thermally conductive material, the base unit including a planar support surface; and
        a first planar cold plate member connected to perpendicularly extend away from the support surface of and conductively cooled by the base unit, the planar support surface supporting the first cold plate member;
    wherein the chassis assembly and the cold plate assembly are configured for slidable engagement with the planar base frame and the planar support surface being generally parallel so that when the chassis assembly and the cold plate assembly are slidably engaged, the first cold plate member is slidably displaced perpendicularly through the elongated slot and through the planar base frame and is received in the first cavity such that the first cold plate member is in direct contact with both the first and second heat producing boards and the planar base frame is seated on the planar support surface.

2. The system for cooling an electronics enclosure of claim 1, further including a third heat producing board, the first heat producing board positioned between the second and third heat producing boards thereby positioning the first cavity on a first side of the first board between the first board and the second board, and a second cavity on a second side of the first board between the first board and the third board.

3. The system for cooling an electronics enclosure of claim 2, further including a second planar cold plate member connected to the base unit and oriented parallel to the first cold plate member, the second cold plate member received in the second cavity and in direct contact with both the first and third boards.

4. The system for cooling an electronics enclosure of claim 3, further including third and fourth planar cold plate members connected to the base unit and oriented parallel to the first cold plate member, the third cold plate member positioned to directly contact an outer facing surface of the second board and the fourth cold plate member positioned to directly contact an outer facing surface of the third board.

5. The system for cooling an electronics enclosure of claim 4, wherein the planar base frame of the chassis assembly includes multiple parallel, elongated slots each slidingly receiving one of the cold plate members.

6. The system for cooling an electronics enclosure of claim 1, wherein the first heat producing board includes a planar face directly facing the second board, and the cold plate member includes opposed planar first and second faces each contacting one of the directly facing planar faces of the first and second boards.

7. The system for cooling an electronics enclosure of claim 1, wherein a thickness of the cold plate is substantially equal to a width of the cavity.

8. A system for cooling an electronics enclosure, comprising:
a chassis assembly including:
multiple heat producing component boards positioned in side-by-side configuration, successive ones of the boards separated by a cavity thereby defining multiple cavities;
an alignment frame having multiple alignment pins arranged in a one-to-one correspondence with each respective multiple heat producing component board, the multiple heat producing boards being arranged along respective first edges perpendicularly to the alignment frame; and
a planar base frame arranged generally perpendicularly to the alignment frame and including a support surface supporting respective second edges of the multiple heat producing component boards, the planar base frame including multiple elongated slots formed therein, the elongated slots defined by respective open apertures arranged passing perpendicularly through the planar base frame; and
a cold plate assembly including:
a base unit of a thermally conductive material, the base unit including a planar support surface; and
multiple cold plate members extending from the base unit, the planar support surface configured to support successive ones of the cold plate members,
wherein the chassis assembly and the cold plate assembly are configured for slidable engagement so that when the chassis assembly and the cold plate assembly are slidably engaged so that the multiple cold plate members slidably are displaced through the respective multiple elongated slots perpendicularly to and through the planar base frame and are received in respective multiple cavities such that at least one cold plate member is in direct contact with a pair of the multiple heat producing component boards adjacent to the at least one cold plate member.

9. The system for cooling an electronics enclosure of claim 8, wherein a first and second of the multiple elongated slots are configured to receive first and second opposed and outermost ones of the multiple cold plate members such that a single planar face of the first cold plate member contacts a planar insert face of the first outermost one of the boards, and a single planar face of the second cold plate member contacts an oppositely facing planar insert face of the second outermost one of the boards.

10. The system for cooling an electronics enclosure of claim 9, wherein an inward facing wall of the first slot is oriented coplanar with the planar insert face of the first outermost one of the cold plate members, and an inward facing wall of the second slot is oriented coplanar with the planar insert face of the second outermost one of the cold plate members.

11. The system for cooling an electronics enclosure of claim 8, wherein the multiple cold plate members include opposed planar first and second faces each contacting a planar surface of one of the boards.

12. The system for cooling an electronics enclosure of claim 8, wherein a center-to-center spacing between any two successive ones of the cold plate members is equal.

13. The system for cooling an electronics enclosure of claim 8, wherein each of the cold plate members is a rectangular shape and corresponds to a rectangular shape of any one of the component boards.

14. The system for cooling an electronics enclosure of claim 8, wherein the thermally conductive material of the base unit is configured to conductively remove heat generated by the boards via direct contact of the boards with the cold plate members.

15. The system for cooling an electronics enclosure of claim 8, wherein each of the cold plate members extends substantially normally to the planar support surface of the base unit.

16. The system for cooling an electronics enclosure of claim 8, wherein a quantity of the cold plate members exceeds a quantity of the boards by one such that each board is contacted on opposite faces of the board by one of the cold plates.

17. An integrated cold plate member and cold plate system for cooling an electronics enclosure, comprising:
a chassis assembly, having:
an alignment frame having multiple alignment pins extending therefrom;
multiple heat producing circuit boards positioned in a side-by-side parallel configuration, each connected to the alignment frame along a first edge using one of the alignment pins to provide a one-to-one correspondence between the respective circuit boards and alignment pins, successive ones of the circuit boards separated by a cavity thereby defining multiple equally spaced cavities;
a planar base frame arranged generally perpendicularly to the alignment frame and having a component board support surface which is substantially planar such that all of the circuit boards are supported along a second edge by the component board support surface and such that all of the circuit boards are co-located with respect to the component board support surface, thereby maintaining alignment between individual circuit boards; and
multiple parallel elongated slots, the elongated slots defined by respective, open apertures passing perpendicularly through the planar base frame; and
a cold plate assembly including:
a base unit, the base unit including a planar support surface; and
multiple cold plate members connected to the base unit, the planar support surface configured to support successive ones of the cold plate members,
wherein the chassis assembly and the cold plate assembly are configured for slidable engagement so that when the chassis assembly and the cold plate assembly are slidably engaged so that the cold plate members are displaced through the respective slots in a direction perpendicular to the support surface and are slidably received in one of the respective cavities when the chassis assembly and the cold plate assembly are assembled such that a selected cold plate member is received between any two successive ones of the circuit boards is in direct contact with both of the successive ones of the circuit boards, thereby acting to conductively remove heat generated by the circuit boards via the cold plate members, and the planar base frame connects to the planar support surface of the base unit.

18. The system for cooling an electronics enclosure of claim 17, further including a plurality of elongated base frame through-slots created in the base unit, each aligned with one of the cavities, the base frame through-slots also aligned with and slidably receiving one of the cold plate members.

19. The system for cooling an electronics enclosure of claim 17, wherein each of the cold plate members extends substantially normal to a planar upper surface of the base unit, and a quantity of the cold plate members exceeds a quantity of the circuit boards by one such that each circuit board is directly contacted on opposite faces of the circuit board by one of the cold plates.

* * * * *